(12) United States Patent
Gadeken et al.

(10) Patent No.: US 7,250,323 B2
(45) Date of Patent: Jul. 31, 2007

(54) METHODS OF MAKING ENERGY CONVERSION DEVICES WITH A SUBSTANTIALLY CONTIGUOUS DEPLETION REGIONS

(75) Inventors: Larry L. Gadeken, Houston, TX (US); Wei Sun, Rochester, NY (US); Nazir P. Kherani, Ontario (CA); Philippe M. Fauchet, Pittsford, NY (US); Karl D. Hirschman, Henrietta, NY (US)

(73) Assignees: Rochester Institute of Technology, Rochester, NY (US); University of Rochester, Rochester, NY (US); BetaBatt Inc., Houston, TX (US)

( * ) Notice: Subject to any disclaimer, the term of this patent is extended or adjusted under 35 U.S.C. 154(b) by 0 days.

(21) Appl. No.: 11/257,520

(22) Filed: Oct. 25, 2005

(65) Prior Publication Data
US 2007/0134840 A1 Jun. 14, 2007

Related U.S. Application Data

(60) Provisional application No. 60/621,795, filed on Oct. 25, 2004.

(51) Int. Cl.
*H01L 21/00* (2006.01)
(52) U.S. Cl. ............... 438/56; 438/107; 438/741; 438/414; 438/356; 257/E21; 257/705
(58) Field of Classification Search ............ 438/56, 438/64, 106, 26, 51, 356, 441, 741, 107
See application file for complete search history.

(56) References Cited

U.S. PATENT DOCUMENTS

| | | | | | |
|---|---|---|---|---|---|
| 5,286,306 | A | * | 2/1994 | Menezes | 136/249 |
| 5,529,950 | A | * | 6/1996 | Hoenlein et al. | 438/107 |
| 5,997,713 | A | * | 12/1999 | Beetz et al. | 205/124 |
| 6,118,204 | A | * | 9/2000 | Brown | 310/303 |
| 6,204,087 | B1 | * | 3/2001 | Parker et al. | 438/56 |
| 6,479,920 | B1 | * | 11/2002 | Lal et al. | 310/309 |
| 6,774,531 | B1 | * | 8/2004 | Gadeken | 310/303 |

OTHER PUBLICATIONS

Kherani et al., "Tritiated Amorphous Silicon for Micropower Applications," *Fusion Technology* 28:1609-1614 (1995).
Lal et al., "A Nuclear Microbattery for Mems Devices," *Proc. 9th International Conference on Nuclear Engineering*, Nice, France, pp. 1-12 (Apr. 2001).
Lal & Blanchard, "The Daintiest Dynamos," *IEEE Spectrum NA*, pp. 36-41 (2004).
Klein, "Bandgap Dependence and Related Features of Radiation Ionization Energies in Semiconductors," *J. Appl. Phys.* 39:2029-2038 (1968).

(Continued)

*Primary Examiner*—David Nhu
(74) *Attorney, Agent, or Firm*—Nixon Peabody LLP

(57) ABSTRACT

A method of making an energy conversion device includes forming a plurality of pores within a substrate and forming a junction region within each of the plurality of pores. Each of the junction regions has a depletion region and each of the plurality of pores defines an opening size in the substrate and a spacing from adjacent pores so that the depletion regions of each of the pores is at least substantially in contact with the depletion region of the pores which are adjacent.

18 Claims, 12 Drawing Sheets

OTHER PUBLICATIONS

*Polymers, Phosphors, and Voltaics for Radioisotope Microbatteries,* Bower et al. Eds., CRC Press, Boca Raton (2002) (Table of Contents only).

Sze, *Semiconductor Devices—Physics and Technology,* 2nd Ed., John Wiley & Sons, New York (2002) (Table of Contents only).

Kosteski et al., "Tritiated Amorphous Silicon Betavoltaic Devices," *IEE Proc.-Circuits Devices Syst.* 150(4):274-281 (2003).

*Handbook of Photovoltaic Science and Engineering,* Luque & Hegedus Eds., Wiley, Chichester, UK (2003) (Table of Contents only).

*Practical Handbook of Photovoltaics: Fundamentals and Applicatons,* Markvart & Castañer Eds., Elsevier Ltd., New York, NY (2003) (Table of Contents only).

*Properties of Porous Silicon,* Canham Eds., IEE/INSEPC, Dera, Malvern, UK (1997) (Table of Contents only).

Bisi et al., "Porous Silicon: A Quantum Sponge Structure for Silicon Based Optoelectronics," *Surf. Sci. Rep.* 38(1):1-126 (2000).

Lehmann & Rönnebeck, "The Physics of Macropore Formation in Low-Doped p-Type Silicon," *J. Electrochem. Soc.* 146(8):2968-2975 (1999).

Christophersen et al., "Crystal Orientation and Electrolyte Dependence for Macropore Nucleation and Stable Growth on p-Type Si," *Mater. Sci. Eng.* B69-70:194-198 (2000).

Fauchet, "Photoluminescence and Electroluminescence from Porous Silicon," *J. Lumin.* 70:294-309 (1996).

Hirschman et al., "Silicon-Based Visible Light-Emitting Devices Integrated into Microelectronic Circuits," *Nature* 384:338-341 (1996).

Striemer & Fauchet, "Dynamics Etching of Silicon for Broadband Antireflection Applications," *Appl. Phys. Lett.* 81(16):2980-2982 (2002).

Swiatek et al., "Characterization and Properties of a Modified Si Solar Cell Emitter by a Porous Si Layer," *Mater. Sci. Eng.* B101:291-296 (2003).

Sze, *Physics of Semiconductor Devices,* 2nd Ed., John Wiley & Sons, New York, NY, Chapter 2, pp. 64-132 (1981).

Sun et al., "A Three Dimensional Porous Silicon p-n Diode for Betavoltaics and Photovoltaics," *Adv. Mater.* 17:1230-1233 (2005).

Rappaport, "The Electron-Voltaic Effect in *p-n* Junctions Induced by Beta-Particle Bombardment," *Phys. Rev.* 93:246-247 (1954).

Rappaport et al., "The Electron-Voltaic Effect in Germanium and Silicon p-n Junctions," *RCA Review* 17:100-128 (1956).

Olsen, "Betavoltaic Energy Conversion," *Energy Conversion* 13:117-127 (1973).

Olsen, "Review of Betavoltaic Energy Conversion," *Proc. 9th Intersociety Energy Conversion Engineering Conference,* San Francisco, CA, pp. 256-267 (Aug. 1974).

Olsen, "Advanced Betavoltaic Power Sources," *Proc. 12th Space Photovoltaic Research and Technology Conference,* Cleveland, OH, in NASA Conference Publication 3210, pp. 754-762 (1993).

* cited by examiner

METHODS OF MAKING ENERGY CONVERSION DEVICES WITH A SUBSTANTIALLY CONTIGUOUS DEPLETION REGIONS

This application claims the benefit of U.S. Provisional Patent Application Ser. No. 60/621,795 filed Oct. 25, 2004, which is herein incorporated by reference in its entirety.

The subject invention was made with government support from the National Science Foundation SBIR Grant No. 0320029. The U.S. Government may have certain rights.

FIELD OF THE INVENTION

This invention relates generally to energy conversion devices and, more particularly, to a method of making a direct energy conversion device with a substantially contiguous depletion region.

BACKGROUND

As the automation of human society progresses, there is a need for energy to power more and more modern electrical devices of various sizes. Although nuclear energy has shown its potential to solve this problem, currently available nuclear conversion technologies suffer from inherent inefficiencies and problems. For example, the two-step nature of the conversion process and the limitations of the thermodynamic cycle consume as much as 90% of the initial nuclear energy in its conversion to electricity.

One area of ongoing research is in the area of nuclear batteries. Based on the discovery in 1954 that p-n junctions can generate electric current from beta particles and alpha particles emitted from radioactive materials, as disclosed in Rappaport P., "The electron voltaic effect in p-n junctions induced by beta particle bombardment," Phys. Rev. 93, 246 (1954) which is herein incorporated by reference in its entirety, research has continued for many years investigating a wide variety materials and techniques to construct nuclear batteries with higher efficiencies as disclosed in Kherani, N. P., et al., "Tritiated amorphous silicon for micropower applications," Fusion Tech. 28, 1609 (1995), Lai, R., et al., "A nuclear microbattery for MEMS devices," Proc. 9th International Conference on Nuclear Engineering, Nice, April, 2001, and Bower, K. E., et al. (eds), Polymers, Phosphors, and Voltaic for Radioisotope Microbatteries, CRC Press, Boca Raton (2002) which are all herein incorporated by reference in their entirety.

The physics of direct conversion from nuclear energy to electric current is illustrated in FIG. 1. Basically, a potential difference is maintained by a voltage source V between a positive and a negative electrode while a charged particle is emitted by an unstable nucleus of a radioactive material. The emitted charged particle creates electron/hole pairs that migrate towards the positive and negative electrodes. A resistive load R completes the circuit so that the positive and negative charges which have migrated recombine and power is generated by this induced current flow in the completed circuit.

An apparatus and method for generating electrical current from a nuclear decay process of radioactive material is disclosed in U.S. Pat. No. 6,744,531 to Gadken, which is herein incorporated by reference in its entirety. This apparatus includes a plurality of junction regions formed by the appropriate construction of a number of p-type and n-type dopant sites. At least a portion of one of the junction regions is disposed in a porous region having an aspect ratio of greater than about 20:1 and is disposed at an angle of greater than about fifty-five degrees measured relative to the surface area in which it is formed. Although this apparatus and method is effective, even further efficiencies and greater performance are desired.

SUMMARY

A method of making an energy conversion device in accordance with embodiments of the present invention includes forming a plurality of pores within a substrate and forming a junction region within each of the plurality of pores. Each of the junction regions has a depletion region and each of the plurality of pores defines an opening size in the substrate and a spacing from adjacent pores so that the depletion regions of each of the pores is at least substantially in contact with the depletion region of the pores which are adjacent.

A method of making an energy conversion device in accordance with embodiments of the present invention includes providing a substrate and forming a plurality of junction regions in the substrate. A first portion of at least one of the junction regions has a declination angle of greater than about fifty-five degrees relative to a second portion of each of the junction regions. Each of the junction regions has a depletion region and each of the junction regions is spaced from the adjacent junction regions so that the depletion regions are at least substantially in contact with each other.

The present invention provides devices and methods that generate electric current by the direct conversion of energy from radioactive materials or light with high efficiency. When compared with prior planar energy conversion systems, the present invention is ten times more efficient in generating power. The ultra-large surface to volume ratio with the present invention also makes device miniaturization possible, reduces the cost of materials, and gives the device high sensitivity and potentially high operational speed, particularly for photodector, light emitting and photonics applications.

DETAILED DESCRIPTION

Figure 1:
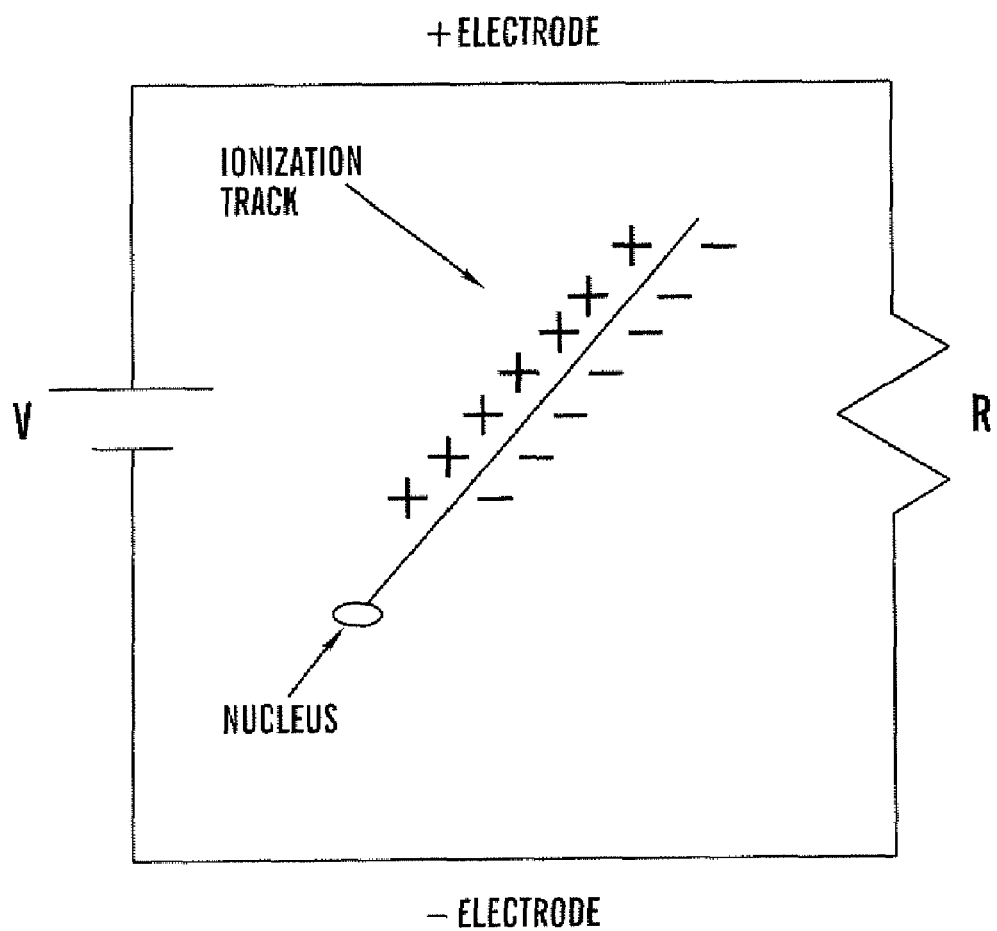
FIG. 1 is a schematic representation of the electrical current generation process achieved by emission of a charge particle from a nucleus of a confined mass of radioactive material as is known in the prior art.
Figure 2:
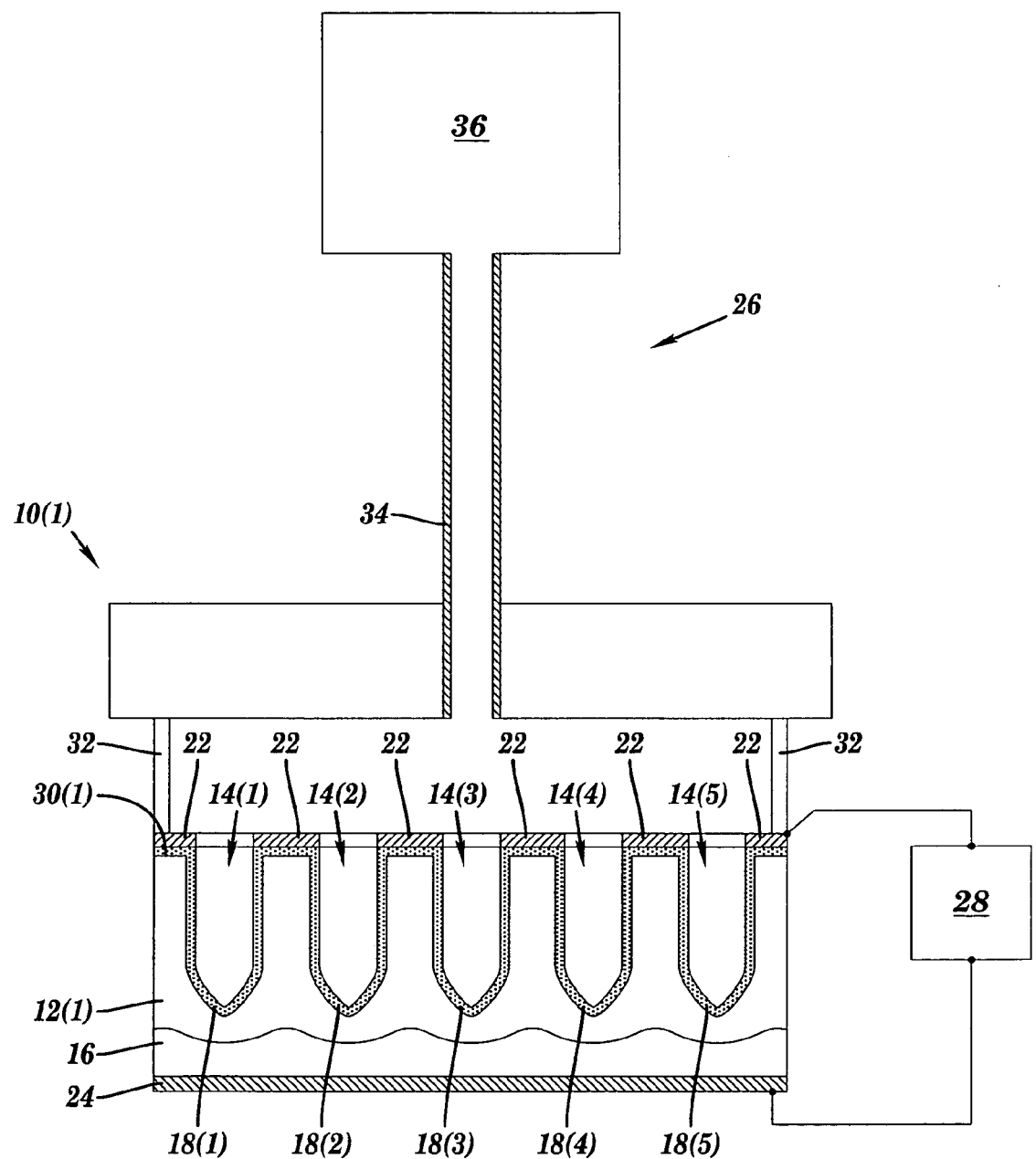
FIG. 2 is a side, cross-sectional view of a direct energy conversion device in accordance with embodiments of the present invention.
Figure 3:
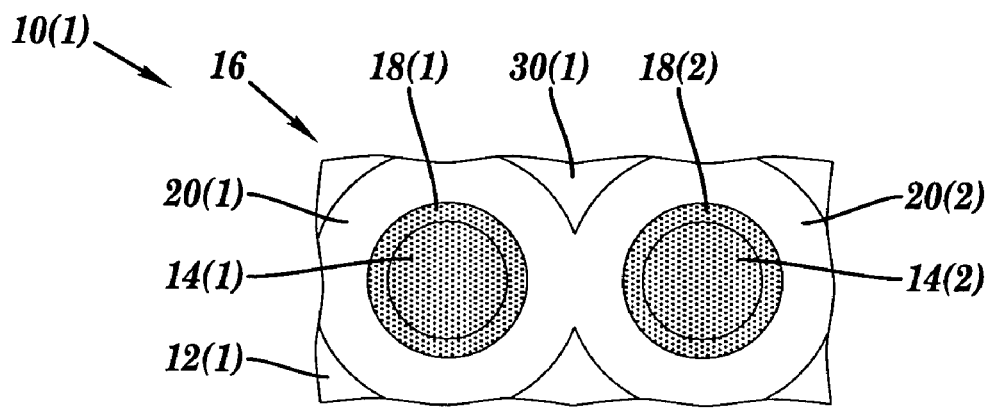
FIG. 3 is a top view of a portion of the direct energy conversion device shown in FIG. 2.
Figure 4:
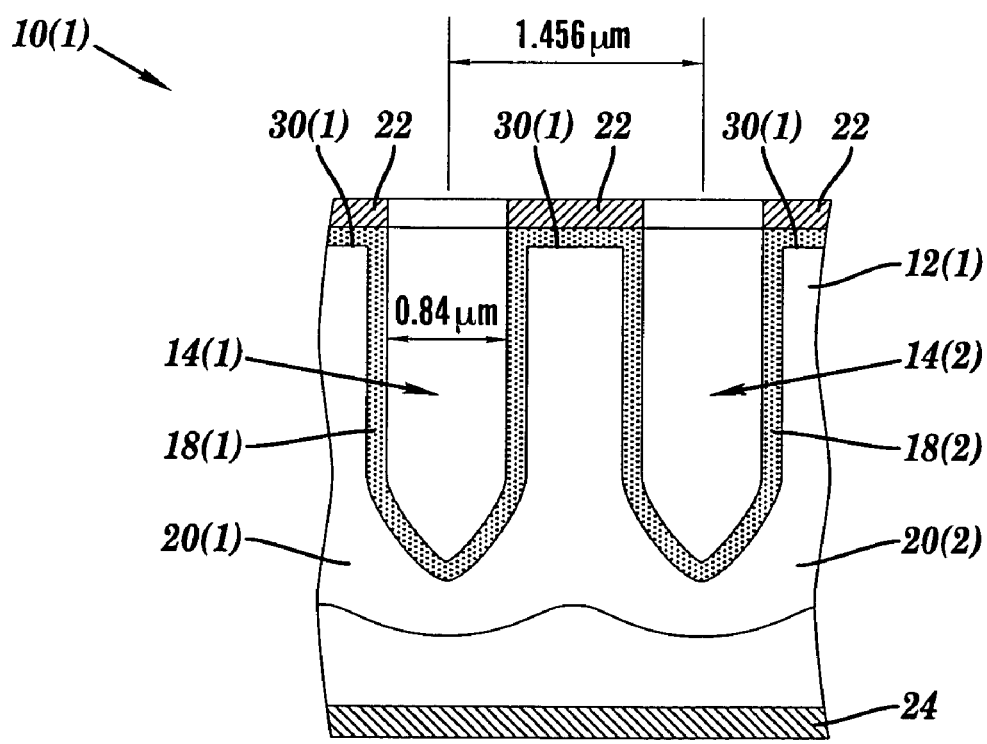
FIG. 4 is a an enlarged, side, cross-sectional view of a portion of the direct energy conversion device shown in FIG. 2.

A direct energy conversion device 10(1) with a substantially continuous depletion region in accordance with embodiments of the present invention is illustrated in FIGS. 2–4. The device 10(1) includes a substrate 12(1), a plurality of pores 14(1)–14(5), a p-type region 16, n-type regions 18(1)–18(5), depletion regions 20(1)–20(5), conductive contacts 22 and 24, a convertible energy supply system 26, and a load 28, although the device 10(1) can comprise other types and numbers of elements in other configurations. The present invention provides a number of advantages including providing a direct energy conversion device that generates electric current by the direct conversion of energy from radioactive materials or light with high efficiency.

Referring to FIGS. 2–4, the substrate 12(1) is doped to provide a p-type region 16 which extends substantially throughout the substrate 12(1), although the substrate 12(1) can be doped with other types of dopants, such as an n-type dopant, and other amounts of the substrate 12(1) can be doped. The substrate 12(1) has a plurality of pores 14(1)–14(5) that extend in from a surface 30(1) of the substrate 12(1), although the device can have other numbers and types of pores or other openings and the pores can be in other locations and orientations.

All of the walls of the pores 14(1)–14(5) and the surface of the substrate 12(1) are doped to provide n-type regions 18(1)–18(5), although the walls of the pores 14(1)–14(5) and the surface of the substrate 12(1) can be doped with other types of dopants, such as a p-type dopant, and other amounts of the walls of the pores 14(1)–14(5) could be doped. The p-type region 16 in the substrate 12(1) and each of the n-type regions 18(1)–18(5) along the walls of each of the pores 14(1)–14(5) form a plurality of p-n junctions. More specifically, one p-n junction is formed by p-type region 16 and each of the n-type regions 18(1)–18(5) adjacent each of the pores 14(1)–14(5), although other types of junction regions could be formed and the junction regions could be formed at other locations.

Figure 5:
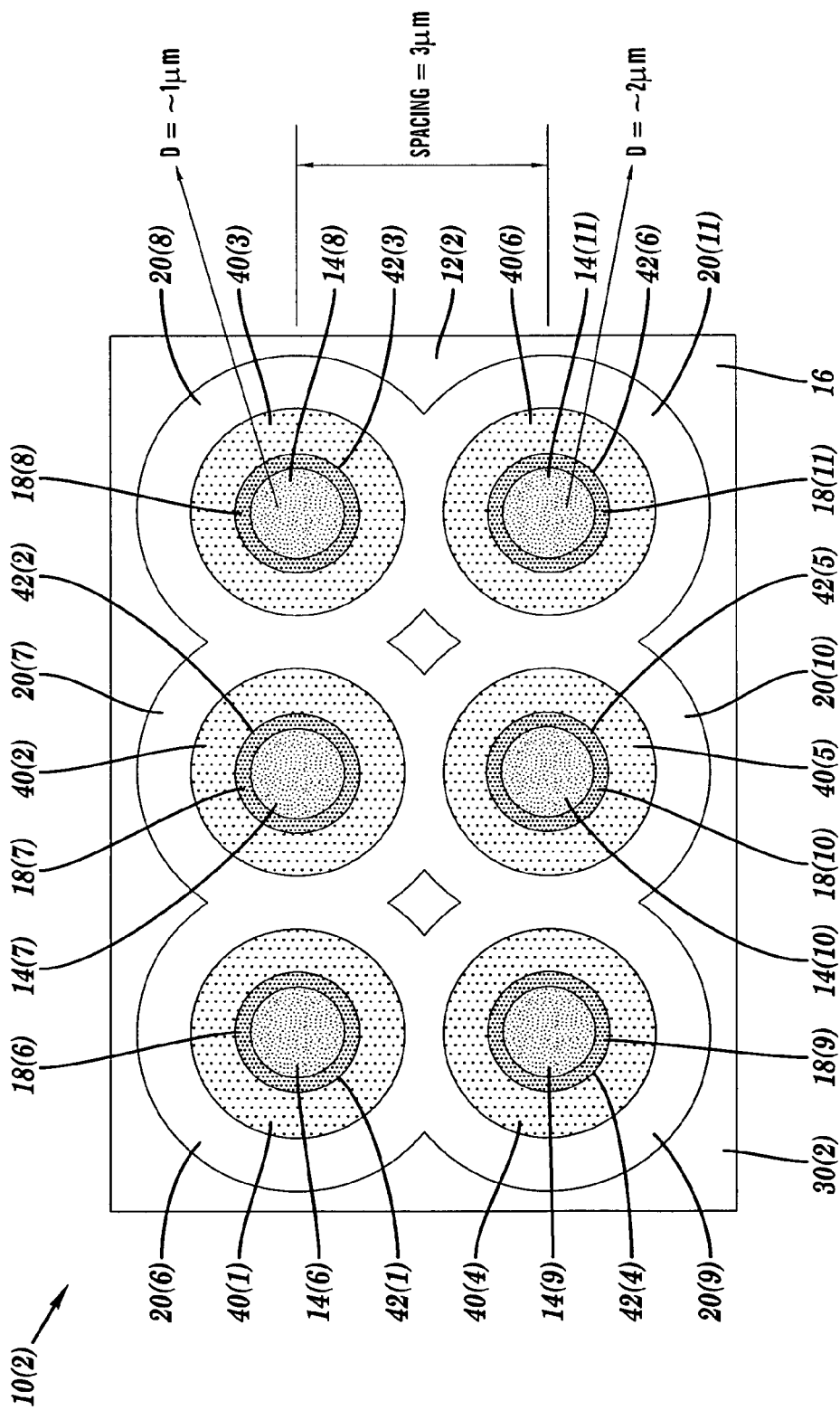
FIG. 5 is a top view of a direct energy conversion device in accordance with other embodiments of the present invention.
Figure 6:
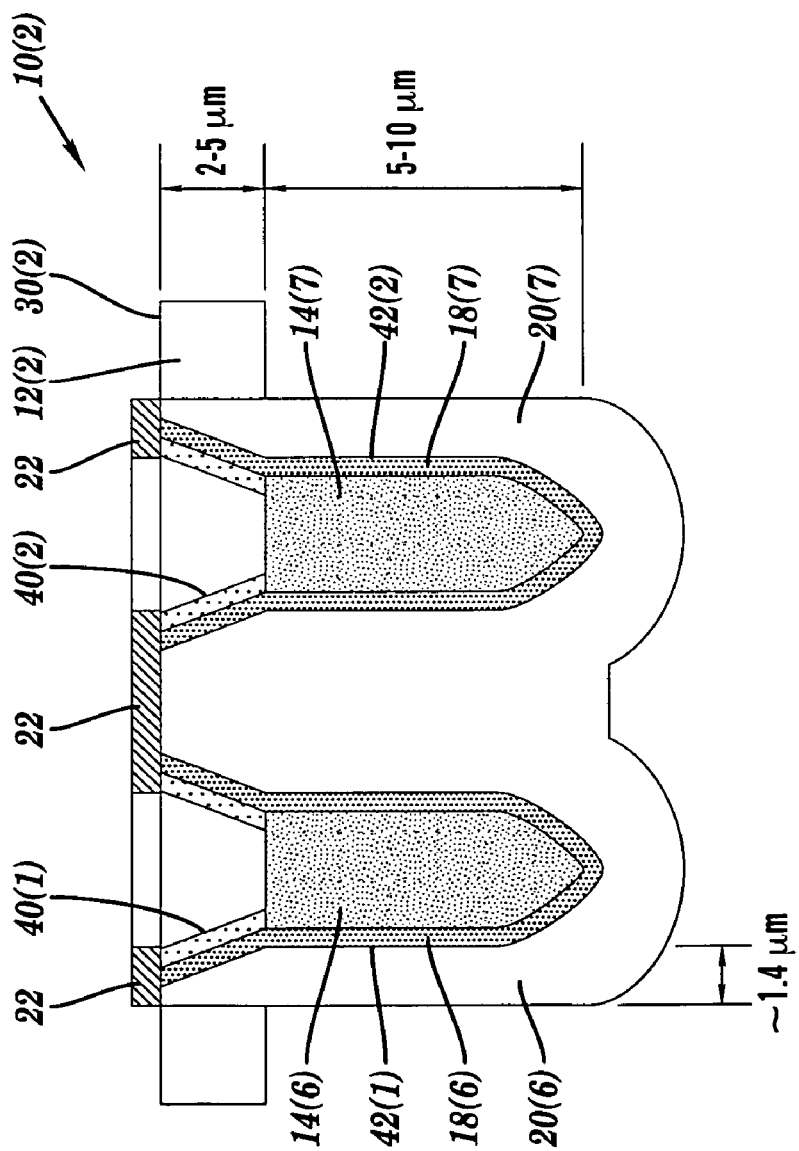
FIG. 6 is a side, cross-sectional view of the direct energy conversion device shown in FIG. 5.

Each of the pores 14(1)–14(5) has a generally, circular cross-sectional shape, although each of the pores 14(1)–14(5) can have other types of cross-sectional shapes. The walls of the pores 14(1)–14(5) have a declination angle θ of greater than about fifty-five degrees measured relative to the surface 30(1) of the substrate 12(1), although the walls of the pores 14(1)–14(5) can have other declination angles θ, such as ninety degrees which makes the walls of the pores 14(1)–14(5) substantially straight or with other configurations as illustrated in FIGS. 5 and 6 and described herein.

By way of example only, in this particular embodiment each of the pores 14(1)–14(5) has an average diameter of about 0.84 μm and a depth of at least 10 μm, although the pores 14(1)–14(5) can have other widths, such as less than 1 μm, and/or other depths, such as 100 μm or more. The pores 14(1)–14(5) have a large depth-to-diameter ratio or aspect ratio of 60:1 to "trap" the photons inside the pores 14(1)–14(5), although the pores could have other aspect ratios, such as an aspect ratio of at least 50:1. With this large depth-to-diameter ratio or aspect ratio and because of the p-n junction adjacent each of the pores 14(1)–14(5), the photons should have a high probability of generating an electrical current. More specifically, with the present invention there is a large surface-to-volume ratio of the pores 14(1)–14(5) to the substrate 12(1) which results in a nearly unity probability that each energetic decay particle will enter one of the p-n junctions because the solid angle for such an occurrence is practically the entire 4Π steradians available. In this particular embodiment, the pores 14(1)–14(5) have an aspect ratio of depth to width of about 60:1, although the pores 14(1)–14(5) can have other aspect ratios, such as at least 50:1.

The large aspect ratio of at least 50:1 for the present invention also results in light photons from a light source being effectively "trapped" inside the pores 14(1)–14(5). The presence of one of the p-n junctions in each of the pores 14(1)–14(5) also means that the light photons can be absorbed at any point within each of the pores 14(1)–14(5). The photovoltaic response of the present invention provides a large increase in efficiency when compared against prior planar shaped energy conversion devices.

Depletion regions 20(1)–20(5) are formed around each of the p-n junctions. In this particular embodiment, each of the depletion regions 20(1)–20(5) which surround the diameter of each pore 14(1)–14(5) gives a total annulus of about 3.64 μm which is 2½ times the average spacing between each of the pores 14(1)–14(5), although the depletion regions can have other dimensions and other types of spacing arrangements for the pores can be used. Although in this embodiment, the adjacent depletion regions 20(1)–20(5) in the device 10(1) overlap, the depletion regions 20(1)–20(5) can have other configurations as long as the depletion regions 20(1)–20(5) are at least substantially in contact with each other.

With the depletion regions 20(1)–20(5) at least substantially in contact with each adjacent depletion region, no regions in the portion of the substrate 12(1) containing the pores 14(1)–14(5) are free of electric fields. As a result, the transport of all electron-hole pairs created by energy absorption events from the radioactive material or light is accelerated by the electric fields which enhances the charge collection efficiency and reduced recombination effects when the device 10(1) is operating either as a photovoltaic device or a photodetector device.

One of the conductive contact 22 is coupled to the n-type regions 18(1)–18(5) on the surface 30(1) of the substrate 12(1) and the other conductive contact 24 is coupled to the p-type region 16 in the substrate 12(1), although the other numbers and types of conductive contacts in other configurations can be used. The conductive contacts 22 and 24 are coupled to the load 28, such as a storage device or a device which requires power to operate, to which the converted energy is supplied, although the conductive contacts 22 and 24 can be coupled to other numbers and types of devices.

The convertible energy supply system 26 includes a housing 32, a supply conduit 34, and a storage container 36 for the radioactive materials, although the source can comprise other types and numbers of elements in other configurations and other sources of convertible energy can be used, such as light. The housing 32 is sealed around a portion of the substrate 12(1) with the pores 14(1)–14(5) and the conduit 34 supplies the radioactive materials from the storage container 36 to the pores 14(1)–14(5). In this particular embodiment, the radioactive material is tritium in a gaseous form, although other types of radioactive material can be used and in other forms, such as a solid which is placed in the pores 14(1)–14(5). Gaseous tritium is relatively low cost, has low toxicity and techniques for safe handling are well documented and straight forward to implement.

The direct energy conversion device 10(1) also has a strong photo response to light. Accordingly, the source of radioactive material can be replaced with a source of light which is directed at the pores 14(1)–14(5).

Referring to FIGS. 5–6, an alternative embodiment for the direct energy conversion device 10(2) is illustrated. The direct energy conversion device 10(2) is identical to the direct energy conversion device 10(1), except as described and illustrated herein. Elements in direct energy conversion device 10(2) which are like those for direct energy conversion device 10(1) will have like reference numerals.

The substrate 12(2) is doped to provide a p-type region 16 which extends substantially throughout the substrate 12(2), although the substrate 12(2) can be doped with other types of dopants, such as an n-type dopant, and other amounts of the substrate 12(2) can be doped. The substrate 12(2) has a plurality of pores 14(6)–14(11) that extend in from a surface 30(2) of the substrate 12(2), although the device can have other numbers and types of pores or other openings and the pores can be in other locations and orientations.

The side walls of the pores 14(6)–14(11) each comprise a first section 40(1)–40(6) which is at a declination angle less than about fifty five degrees with respect to the surface 30(2) and a second section 42(1)–42(6) which is at a declination angle greater than about fifty five degrees with respect to the surface 30(2), although the side walls of the pores 14(6)–14(11) can comprise other numbers and types of walls in other configurations. In this particular embodiment, the walls of the second section 42(1)–42(6) are at a declination angle of about ninety degrees with respect to the surface 30(2) and the walls of the second section 42(1)–42(6) are longer than the walls of the first section 40(1)–40(6), although other dimensions and configurations can be used. The surface of the substrate 12(2) and the walls of the pores 14(6)–14(11) are doped to provide n-type regions 18(6)–18(11), although the walls of the pores 14(6)–14(11) and the surface 30(2) of the substrate 12(2) can be doped with other types of dopants, such as a p-type dopant, and other amounts of the walls of the pores 14(6)–14(11) could be doped. The p-type region 16 in the substrate 12(2) and each of the n-type regions 18(6)–18(11) along the walls of each of the pores 14(6)–14(11) form a plurality of p-n junctions. More specifically, one p-n junction is formed by p-type region 16 and each of the n-type regions 18(6)–18(11) adjacent each of the pores 14(6)–14(11), although other types of junction regions could be formed and the junction regions could be formed at other locations.

Each of the pores 14(6)–14(11) has a generally, cone-shaped cross-sectional shape for the first sections 40(1)–40(6) and a circular cross-sectional shape for the second sections 42(1)–42(6), although each of the pores 14(6)–14(11) can have other types of cross-sectional shapes for each of the sections 40(1)–40(6) and 42(1)–42(6).

By way of example only, in this particular embodiment each of the pores 14(6)–14(11) has an average diameter of about 1.0 μm and a depth of about 5 μm to 10 μm, although the pores 14(6)–14(11) can have other widths, such as less than 1 μm, and/or other depths, such as 100 μm or more.

Depletion regions 20(6)–20(11) are formed around each of the p-n junctions. In this particular embodiment, each of the adjacent depletion regions 20(6)–20(11) in the device 10(2) overlap, although the depletion regions 20(6)–20(11) can have other configurations as long as the depletion regions 20(6)–20(11) are at least substantially in contact with each other. Again, with the depletion regions 20(6)–20(11) at least substantially in contact with each adjacent depletion region, no regions in the portion of the substrate 12(2) containing the pores 14(6)–14(11) are free of electric fields. As a result, the transport of all electron-hole pairs created by energy absorption events from the radioactive material or light is accelerated by the electric fields which enhances the charge collection efficiency and reduced recombination effects when the device 10(2) is operating either as a photovoltaic device or a photodetector device.

One of the conductive contact 22 is coupled to the n-type regions 18(6)–18(11) on the surface 30(2) of the substrate 12(2) and the other conductive contact is coupled to the p-type region 16 in the substrate 12(2), although the other numbers and types of conductive contacts in other configurations can be used. The conductive contacts can be coupled to a load, such as a storage device or a device which requires power to operate, to which the converted energy is supplied, although the conductive contacts can be coupled to other numbers and types of devices.

The operation of the direct energy conversion device 10(1) will now be described with reference to FIGS. 2–4. Tritium gas is supplied from the container via the conduit to the pores 14(1)–14(5) in the substrate 12, although other types of energy can be supplied, such as other types of radioactive materials or light, and the energy can be supplied in other manners. Energetic decay particles emitted by the radioactive material in the pores 14(1)–14(5) are captured in the p-n junctions. As a result, the p-n junctions creates electron/hole pairs that migrate towards the conductive contacts 22 and 24 from the particles captured by the p-n junctions. The load 28 completes the circuit so that the positive and negative charges which have migrated recombine and power is generated by the induced current flow in the completed circuit. The power generated by this particular design is ten times more efficient than power coming from a planar device surface.

The direct energy conversion device 10(1) also can be used as a photo-voltaic device. The operation of the direct energy conversion device 10(1) is the same as described above, except that energy from the captured light from the light source is captured in the p-n junctions. The p-n junctions create electron/hole pairs from the captured light that migrate towards the conductive contacts 22 and 24 and generate the electrical current.

The operation of the direct energy conversion device 10(2) is identical to the operation of the direct energy conversion device 10(1) and thus will not be described here again.

EXAMPLES

Figure 7A:
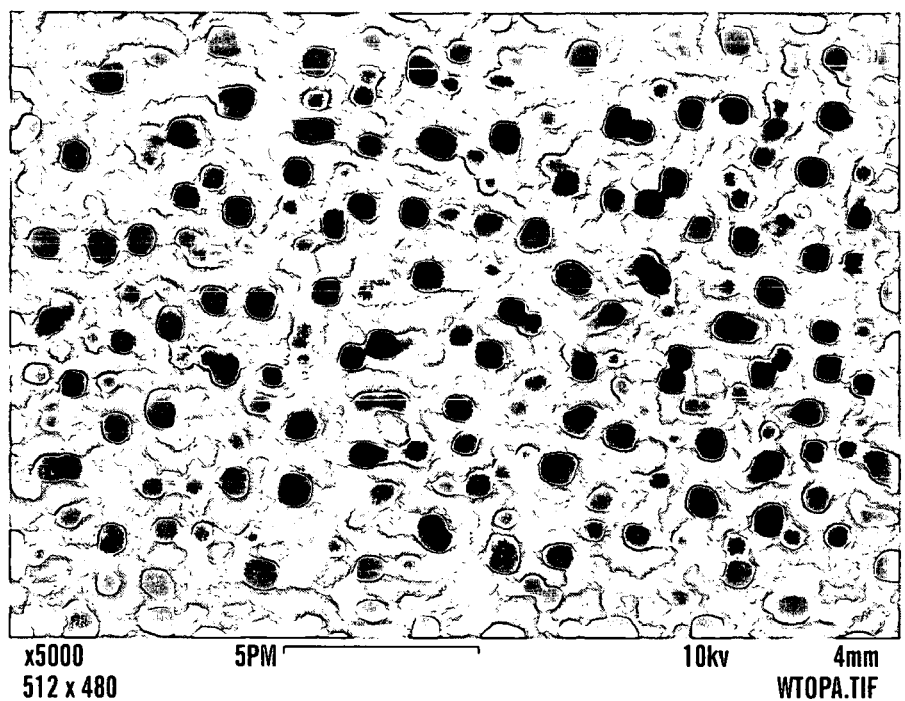
FIG. 7A is a top view of pores in a nuclear to electrical energy conversion device.
Figure 7B:
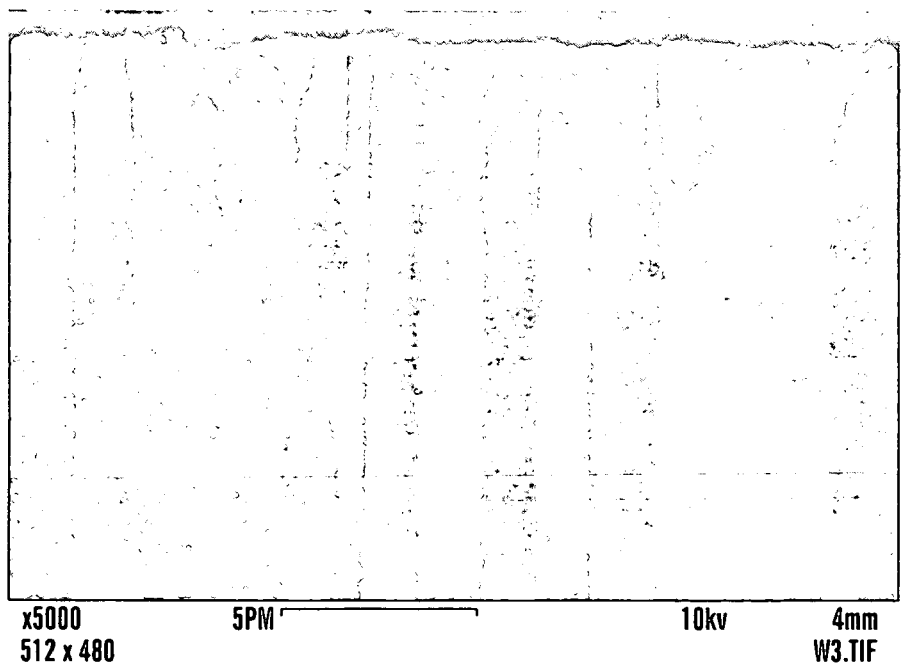
FIG. 7B is a side view of pores in a nuclear to electrical energy conversion device.

Top and side views of an exemplary, cleaved Si chip showing representative cross section of pores in a direct energy conversion device in accordance with embodiments of the present invention are illustrated in FIGS. 7A and 7B. Scanning electron microscope (SEM) data was used to estimate the geometry of the randomly distributed pores. The area of the largest SEM view was 337.5 μm covering a rectangle 15 μm wide by 22.5 μm high. A manual count showed 135 clear throats for the pores and 55 blurred throats for a total of 190 pores. This gives the average area surrounding each pore as 1.78 μm². A selection of 50 pores in this area gave the average pore diameter: $d_{avg.}$=0.837±0.125 μm. A total of seventeen channels in the pores were randomly selected from an SEM cross section view to estimate the average depth of the pores. The results for the average depth were: $h_{avg.}$=43.1±1.18 μm.

In this example, each one inch×one inch pSi chip was patterned before etching to contain the porous area within a circle 1.52 cm in diameter. The above data gives the number of pores in this area as $N_{190}$=1.027×10⁸ or 103 million. Thus, the total internal surface area of the pores is 116.4 cm² and the total pore volume is 2.435×10⁻³ cm³ on each pSi chip. The fraction of the surface containing pores is 0.31 and the corresponding planar fraction is 0.69.

The working performance of the p-n junctions in this example investigated by performing current-voltage (I-V) measurements with both planar and pSi chips in two different conditions. "Bare" Si chips were characterized within a desktop test box that could be completely closed to provide dark conditions. Photo effect measurements used illumination either from fluorescent room lighting or a 25 W Bausch & Lomb collimated light source, although other light sources could be used. Other Si chips from the same fabrication runs as the 'bare' chips were installed in Wafer Test Fixtures (WTFs).

Each WTF comprised two steel plates 2½ in. in diameter bolted together and clamping a copper fill pipe, an indium wire seal ring, and a Si chip tightly together. PEEK insulators isolated the front and back sides of the Si chips electrically from the top and bottom plates, although other types of insulators could be used. Small pieces of Kapton tape were also used on the chip corners as additional insulators, although other types of tape and securing mechanisms can be used. The front-side p-n junctions faced the fill pipe. All measurements were performed before the WTFs with the Si chips were filled with tritium.

The I-V characterization used a Hewlett-Packard 4145B Semiconductor Parameter Analyzer (SPA), although other devices for performing this characterization could be used. Each "bare" sample was mounted in the test box on a flat gold surface held by vacuum with its "back" n-side contact facing down. The "front" p-side of the Si chip was contacted by a tungsten needle pressed to the aluminum contact by mechanical force. Metal clamps were used to make electrical connections with the WTFs at the test box. Voltages in the range of negative two volts to positive two volts were applied to each sample and the corresponding currents were recorded and the data was captured and analyzed.

Figure 8A:
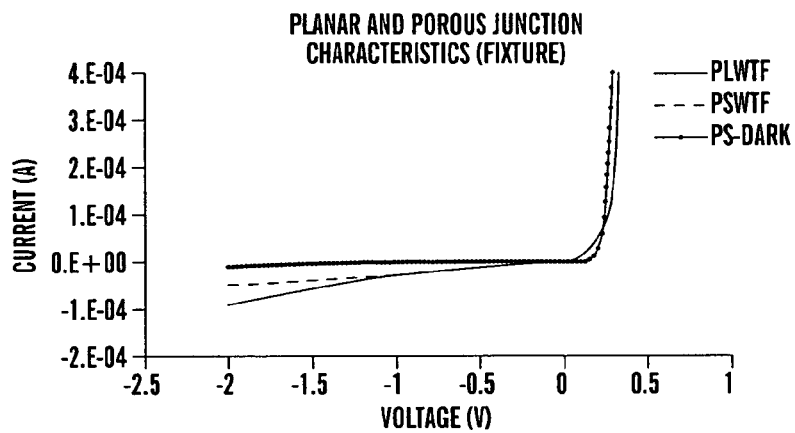
FIG. 8A is a graph of planar and porous junction I-V characteristics (fixture)
Figure 8B:
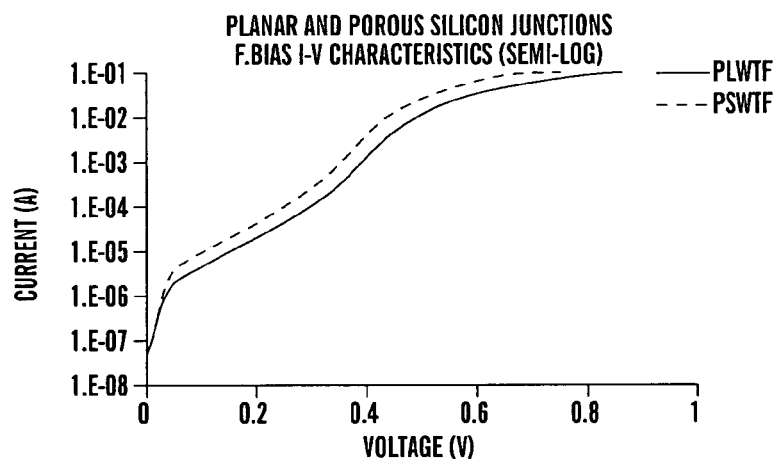
FIG. 8B is a graph of planar and porous junctions F.bias I-V characteristics (semi-log)
Figure 8C:
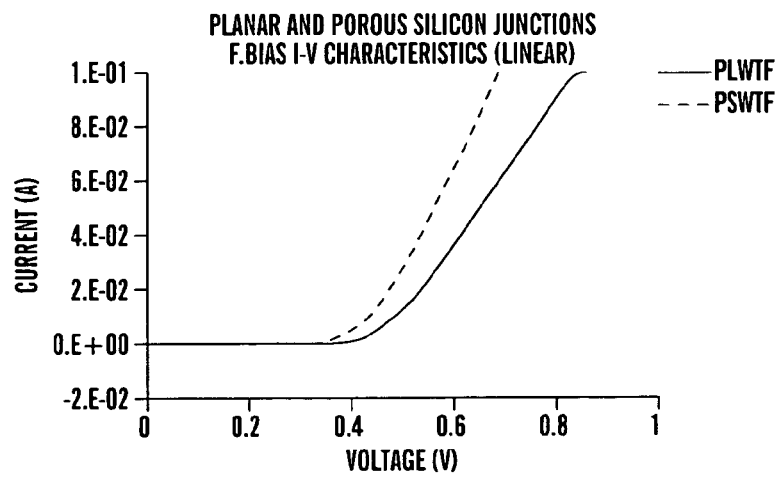
FIG. 8C is a graph of planar and porous junctions F.bias I-V characteristics (linear)

Set forth in Table 1 below is the nomenclature used for the graphs of Porous diodes I-V characteristics shown in FIGS. 8A–8C:

| | |
|---|---|
| PS - dark | "bare" pSi chip in test box with no illumination |
| PS - room light | "bare" pSi chip in fluorescent room lighting |
| PS - bright light | "bare" pSi chip illuminated with 25 W Bausch & Lomb lamp |
| PLWTF | Planar Si diode chip mounted in WTF assembly |
| PSWTF | pSi diode chip mounted in WTF assembly |
| PSWTF - light | pSi diode chip in WTF with Bausch & Lomb lamp shining down fill pipe |

The I-V characteristics of the samples indicated quite good properties for the p-n junction and also demonstrated significant photo response. The plot of FIG. 8A shows the overall diode-like character of both planar and pSi chips. Semi-log and linear plots of FIGS. 8B and 8C have expanded scales to show details under forward bias. FIG. 8B shows normal forward-bias diode characteristics that are well matched with the exception of ~0.05V shift between the recombination/generation region and Shockley diffusion current region. Both pSi chips show very similar I-V characteristics at forward and reverse biases. Both are rectifiers and both have broadly similar leakage currents. The WTF samples have larger leakage currents than the "bare" Si chip diodes that is likely due to the slightly worse electrical contacts in the WTFs. Further tests of the bare chip with and without Kapton tape illustrated that the tape had no effects on the I-V characteristics of those devices (data not shown).

Several tests were made to evaluate the photo response of the pSi diodes. The 50 nm thick Al front contact blocked light from reaching the p-n junctions on planar Si chips and the only response observed was a very small offset due to light entering at the clean cleaved edges. By contrast, the pSi chips showed a very pronounced photo response. This is thought to be entirely due to photo conversion in the p-n junctions along the pore walls since the evaporated Al does not penetrate into the pore channels.

Figure 9A:
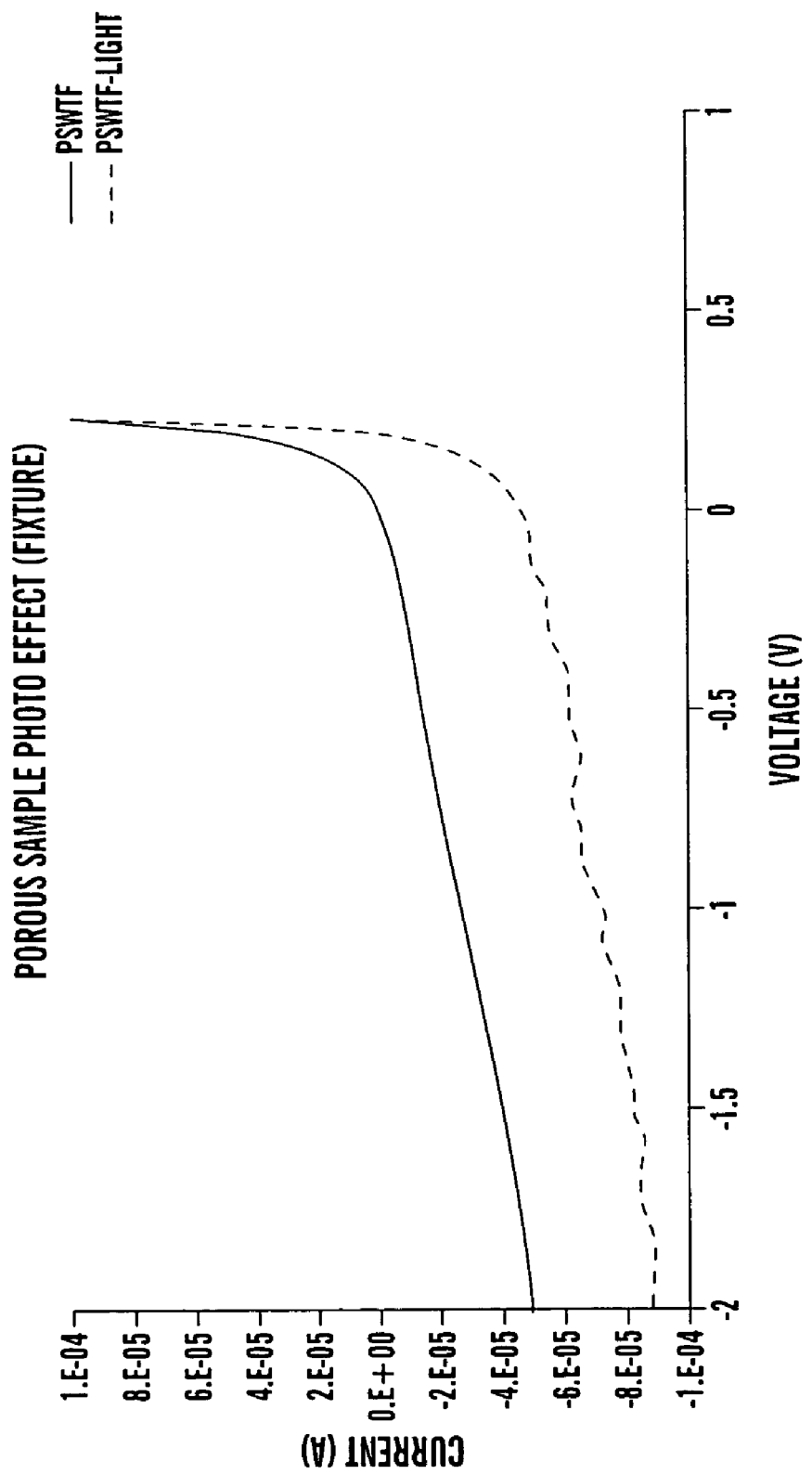
FIG. 9A is a graph of porous sample photo effect I-V characteristics (fixture)
Figure 9B:
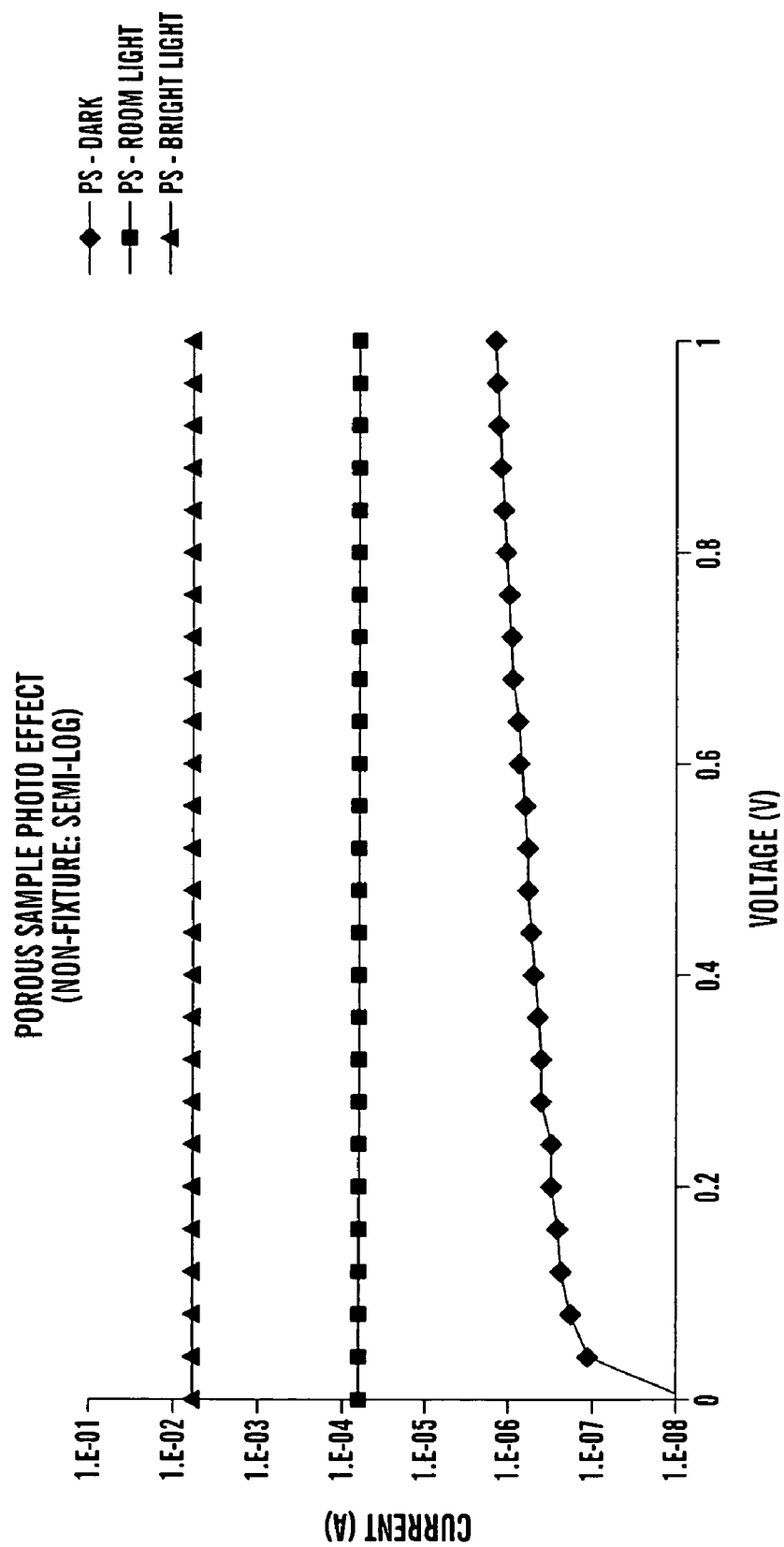
FIG. 9B is a graph of porous sample photo effect I-V characteristics (non-fixture:semi-log)

FIG. 9A shows the effect of the Bausch & Lomb collimated light source shining down the 1.6 mm diameter fill pipe aperture. The photo effect is evident in the two-fold current increase under reverse bias. The photo response is further illustrated by different illumination conditions shown in the plots of FIG. 9B. The reverse current increases by two orders of magnitude when the device is exposed to the room light. Part of this increase is due to the larger area exposed on the "bare" pSi chip. As expected, the collimated light source produces a correspondingly larger effect. An increase of 10⁴ in the reverse current, relative to dark conditions, is observed in this case.

To optimize the working properties of the p-n junctions, some basic calculations were done to determine the geometric parameters as disclosed in Neamen, D. A., Semiconductor Physics and Devices: Basic Principles, McGraw-Hill, Boston (2003) which is herein incorporated by reference in its entirety. At equilibrium state, the built-in voltage ($V_{bi}$) and the depletion widths on the n and p sides ($X_n$ and $X_p$ respectively) are described as follows:

$$V_{bi} = \frac{kT}{e} \ln\left(\frac{N_a N_d}{n_i^2}\right) \quad (1)$$

$$X_n = \left[\frac{2\varepsilon_s V_{bi}}{e}\left(\frac{N_a}{N_d}\right)\left(\frac{1}{N_a + N_d}\right)\right]^{\frac{1}{2}} \quad (2)$$

$$X_p = \left[\frac{2\varepsilon_s V_{bi}}{e}\left(\frac{N_d}{N_a}\right)\left(\frac{1}{N_a + N_d}\right)\right]^{\frac{1}{2}} \quad (3)$$

For room temperature we take T=300° K so that the value of kT/e in equation (1) is 0.0259 eV and $n_i^2$=1.9×10²⁰. For silicon material, $\varepsilon_s$=11.7×8.85 10⁻¹⁴. Considering the resistivity of our initial boron-doped silicon wafer (20–30 Ωcm), $N_a$=5×10¹⁴ cm⁻³. The targeted phosphorus concentrations are in the range $N_d$=10¹⁷~10²⁰ cm⁻³. Inserting these parameters into equations (1) to (3), the built-in voltage of our targeted diode is determined to be in the range 0.68–0.86 V. The depletion width at "p" side is in the range 1.32–1.49 µm, while the depletion width at "n" side is negligible.

The energetic electrons (betas) emitted when tritium nuclei decay have a spectrum of energies with an average value of 5.69 keV and a maximum of 18.6 keV. The corresponding average range in silicon is 0.79 µm and a maximum of 4.3 µm. A depletion depth of 1.4 µm is greater than the range of 84% of the incident betas ($E_\beta \leq 9.3$ keV) where all the electron-hole pairs created will be separated by the built-in electric field and collected. The large mobilities and low recombination cross sections of this high quality silicon material will also result in the collection of most of the electron-hole pairs created by higher energy betas that penetrate beyond the depletion depth.

The normal diode behaviors and the significant photo effect illustrate that the Si chips as described herein in the direct energy conversion devices are effective in collecting the energy from the beta decay or light and transforming it to current. In the case of beta decay the energetic beta particles substitute for the role of photons in generating electricity. This is sometimes known as the beta voltaic effect. The use of porous silicon in the direct energy conversion devices as described herein does increase the conversion efficiency of radioisotope energy conversion.

I-V measurements were performed after WTFs 1 and 2 were loaded with tritium gas. The preliminary analysis was based on the discussion of Section 6.2, "Silicon Cells for Direct Conversion of Tritium," in Bower, K. E., et al. (eds), Polymers, Phosphors, and Voltaic for Radioisotope Microbatteries, CRC Press, Boca Raton (2002) which is herein incorporated by reference in its entirety. The data in these examples showed an efficiency increase of a factor of ten for conversion in the direct energy conversion devices with the pores when compared against prior devices with planar surface. This is evidently due to the increase in effective solid angle to essentially $4\pi$ steradians within the channels of the pores. The efficiency of the p-n junctions fabricated for this work is significantly smaller than that reported in Bower, K. E., et al. (eds), Polymers, Phosphors, and Voltaic for Radioisotope Microbatteries, CRC Press, Boca Raton (2002) which is herein incorporated by reference in its entirety. However, the photon fill factor of 0.65 was the same as that in Bower, K. E., et al. (eds), Polymers, Phosphors, and Voltaic for Radioisotope Microbatteries, CRC Press, Boca Raton (2002) which is herein incorporated by reference in its entirety. On the other hand the beta fill factor of 0.27 is half that given in Bower, K. E., et al. (eds), Polymers, Phosphors, and Voltaic for Radioisotope Microbatteries, CRC Press, Boca Raton (2002) which is herein incorporated by reference in its entirety.

Figure 10A:
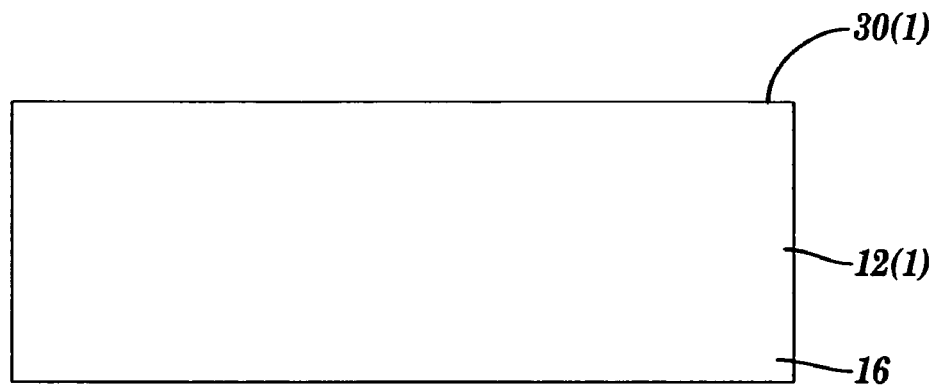
FIGS. 10A–10D are cross-sectional diagrams illustrating a method of making a direct energy conversion device in accordance with other embodiments of the present invention.

A method of making a direct energy conversion device 10(1) in accordance with embodiments of the present invention is illustrated in FIGS. 10A–10D. Referring more specifically to FIG. 10A, a substrate 12(1) comprising a silicon wafer doped with boron to form the p-type region 16 is provided, although the substrate 12(1) can be made of another materials or materials and can be doped with another type of dopant or dopants to form this or other types of regions, such as an n-type region. The substrate 12(1) has a thickness of about 550 µm and a resistivity of 20–30' Ω cm, although the substrate 12(1) can have other thicknesses and resistivities.

Figure 10B:
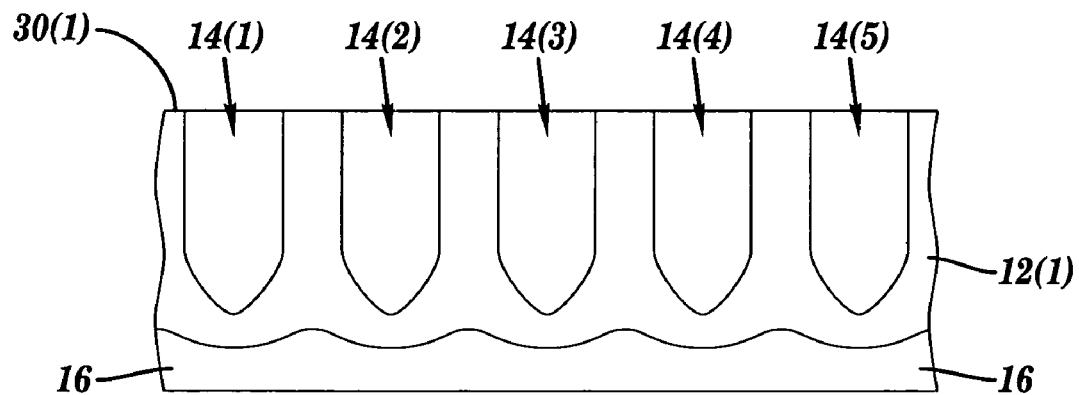

Next, the pores 14(1)–14(5) are formed in the substrate 12(1) as shown in FIG. 10B. More specifically, in this particular embodiment the substrate 12(1) is prepared using an anodization process in a single etching cell, although the substrate 12(1) can be prepared in other manners. A tungsten mesh is used as the cathode on one side of the substrate 12(1) and an aluminum sheet pressed against an opposing side of the substrate 12(1), although other conductive members in other configurations can be used. An electrolyte of 4 wt.-% hydrofluoric acid (HF) in dimethylformamide (DMF) is used for the anodization, although other materials can be used. The substrate 12(1) is first dipped into a buffered oxide etchant to strip the natural oxide on the surface, although the natural oxide can be removed with other materials and in other manners. Next, the substrate 12(1) is etched in the single etching cell with a current density of 2 mA cm$^{-2}$ for about 180 minutes to produce the pores 14(1)–14(5) having a diameter of less than about 1 µm and a depth of about 40 to 50 µm, although the pores can be etched in other manners and can have other dimensions, such as a depth of over 100 µm. Next, the substrate 12(1) with the pores 14(1)–14(5) is cleaned to eliminate metal and organic species that could cause contamination in later steps.

The pores 14(1)–14(5) are formed to have a cross-sectional size and spacing so that the depletion regions 20(1)–20(5) overlap, although the pores 14(1)–14(5) can have other configurations as long as adjacent depletion regions 20(1)–20(5) are at least in contact with each other. Although one method for making the pores 14(1)–14(5) is describe above, other methods for making the pores 14(1)–14(5), with other numbers, sizes and spacing for the pores 14(1)–14(5) can be used.

Figure 10C:
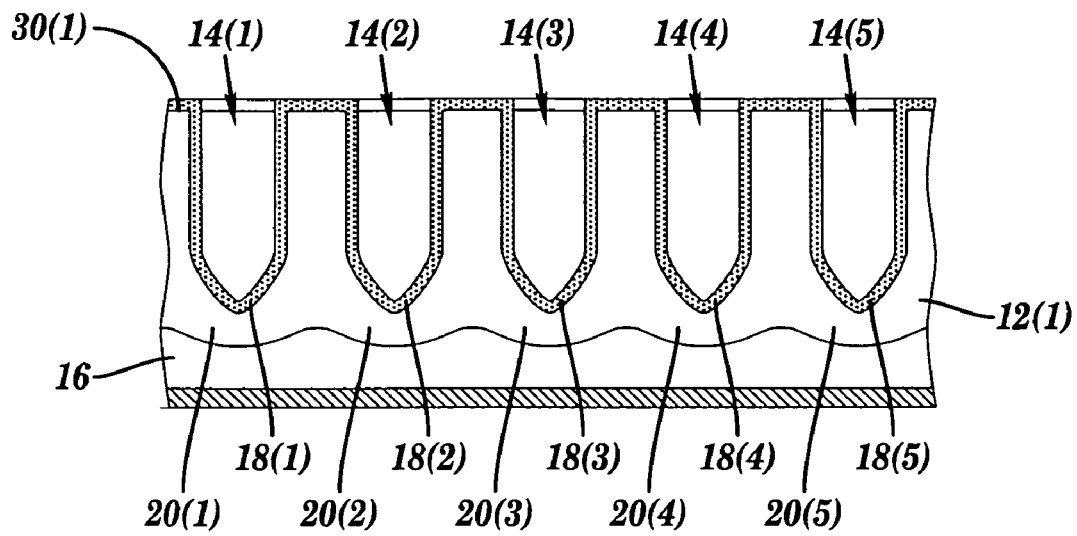

Next, the p-n junction regions are formed adjacent each of the pores 14(1)–14(5) as shown in FIG. 10C. More specifically, phosphorus, an n-type dopant, is introduced into the pores 14(1)–14(5) of the substrate 12(1) which is doped to form n-type regions 18(1)–18(5), although another type of dopant or dopants can be used to form this or other types of regions, such as a p-type region. The substrate 12(1) is soaked in a tube furnace for nine minutes to make a shallow n+ layer which is about 200 nm thick on the surface 30(1) and in the walls of the pores 14(1)–14(5), although the substrate 12(1) can be processed in other manners. Next, the n+ layer formed on the back or opposing surface of the substrate 12(1) from the surface 30(1) is removed by $SF_6$ plasma dry etching, although the n+ layer formed on the back or opposing surface of the substrate 12(1) can be removed in other manners.

Figure 10D:
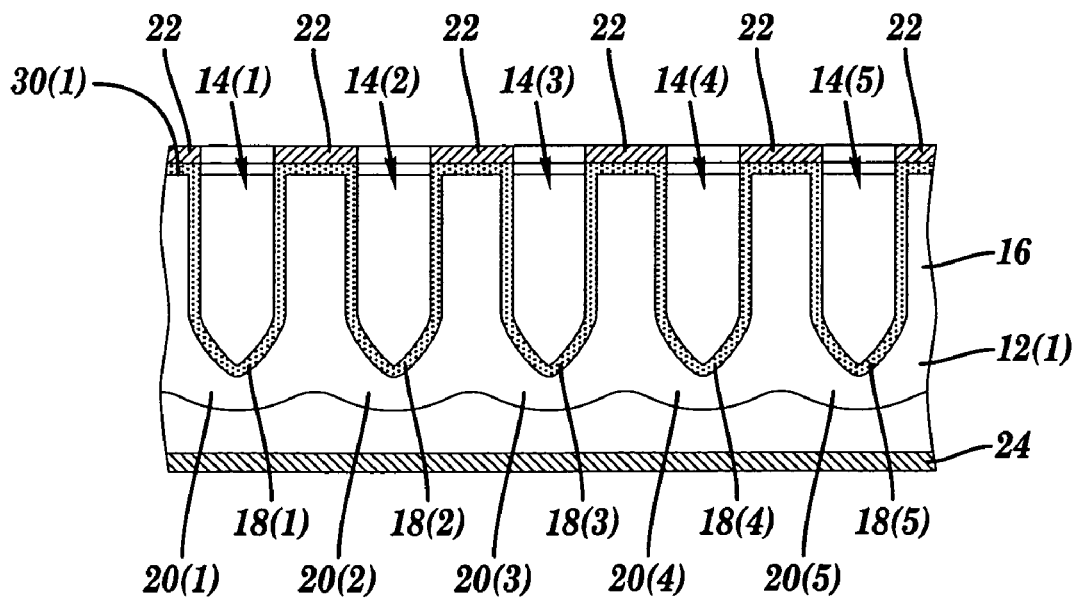

Next, the conductive contacts 22 and 24 are formed on the direct energy conversion device 10(1) as shown in FIG. 10D. More specifically, the substrate 12(1) is dipped into a buffered oxide etchant to strip off the $SiO_2$ so that good ohmic contact can be made to the substrate 12(1), although the surfaces of the substrate 12(1) can be processed in other manners. Next, the substrate 12(1) is placed in a high vacuum chamber at about <$10^{-7}$ torr or about $133 \times 10^{-7}$ for the evaporation of Al–Si alloy of about 2% silicon, although the substrate 12(1) can be placed in other housings, at other pressures, and can be processed with other conductive materials. Conductive contacts 22 and 24 comprising aluminum layers of about 50 nm on the surface 30(1) of the substrate 12(1) and about 200 nm on the opposing surface of the substrate 12(1), although the conductive contacts 22 and 24 can be made of another material or materials and with other thicknesses. To avoid a Shottky barrier at the interface between the conductive contacts 22 and 24 and the substrate 12(1), the substrate 12(1) and conductive contacts 22 and 24 are annealed at 420 degrees C. for fifteen minutes, although other methods for avoiding a Shottky barrier can be used. The direct energy conversion device 10(1) are then rinsed with acetone, isopropyl alcohol and deionized water, although the direct energy conversion device 10(1) can be cleaned in other manners.

Figure 11A:
FIGS. 11A–11E are cross-sectional diagrams illustrating another method of making a direct energy conversion device in accordance with other embodiments of the present invention.

A method of making a direct energy conversion device 10(2) in accordance with other embodiments of the present invention is illustrated in FIGS. 11A–11E. Referring more specifically to FIG. 11A, a substrate 12(2) comprising a silicon wafer doped with boron to form the p-type region 16 is provided, although the substrate 12(1) can be made of another materials or materials and can be doped with another type of dopant or dopants to form this or other types of regions, such as an n-type region. The substrate 12(1) has a thickness of about 550 µm and a resistivity of 20–30' Ω cm, although the substrate 12(1) can have other thicknesses and resistivities.

Figure 11B:
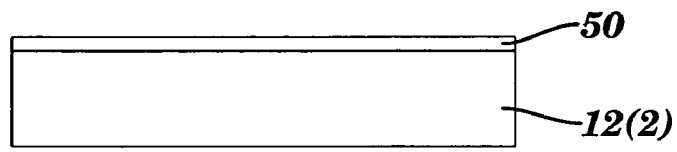
Figure 11C:
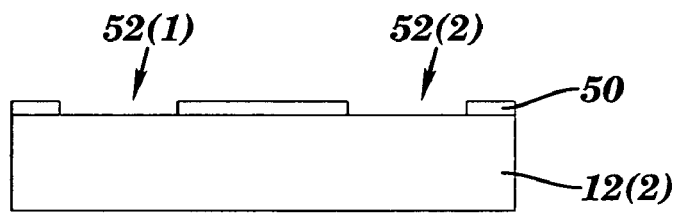

Next, a photoresist material 50 is deposited on one of the surfaces 30(2) of the substrate 12(2) by spinning as shown in FIG. 11B, although another type of masking material or materials and other methods for depositing the masking materials can be used. Next, a grid for the location of each of the pores 14(6)–14(11) is created by interfero-lithography on the photoresist material 50 resulting in the open portions 52(1) and 52(2) in the photoresist material 50 over the location of the pores 14(6) and 14(7) as shown in FIG. 11C, although the mask created by the photoresist material 50 can be formed in other manners.

For ease of illustration, only the open portions for pores 14(6) and 14(7) are shown and described herein for the method of making the direct energy conversion device 10(2) and the same method can be used to form the open portions for pores 14(8)–14(11) or for any other number of pores. The size and location of the pores 14(6)–14(11) for the direct energy conversion device 10(2) are selected to be formed in the mask formed in the photoresist material 50 so that each of the depletion regions 20(6)–20(11) are at least in a contact with the adjacent depletion regions.

Figure 11D:
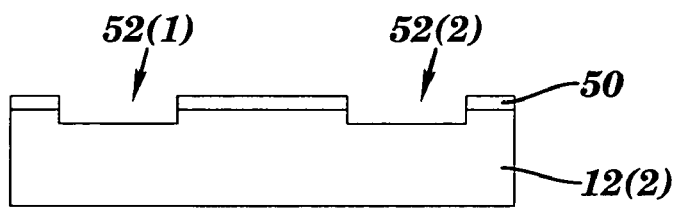

Next, the mask formed by the remaining photoresist material 50 is transferred to the surface 30(2) of the substrate 12(2) with a buffer oxide etchant through the open portions 52(1) and 52(2), to begin to form the pores 14(6) and 14(7) as shown in FIG. 11D, although other manners for beginning to form the pores 14(6) and 14(7) and other pores can be used.

Figure 11E:
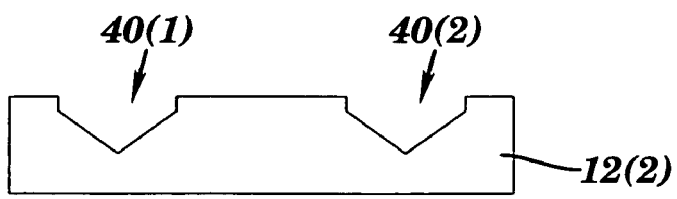

Next, the substrate 12(2) is prestructured with inverted pyramids which form the first sections 40(1) and 40(2) by EDP etching as shown in FIG. 11E, although other manners for forming the first sections 40(1) and 40(2) and other first sections can be used. The first sections 40(1) and 40(2) are formed at a declination angle less than about fifty five degrees with respect to the surface 30(2) and the second section 42(1) and 42(2) (shown in FIG. 6) are formed at a declination angle greater than about fifty five degrees with respect to the surface 30(2), although the side walls of the pores 14(6) and 14(7) as well as the other pores can comprise other numbers and types of walls in other configurations. The process for forming the second sections 42(1) and 42(2) as well as the remaining process steps to from the direct energy conversion device 10(2) are the same as the process steps for forming the pores 14(1)–14(5)m forming the p-n junctions, and forming the conductive contacts as illustrated in FIGS. 10B–10D and described herein and thus will not be described again. With this method, each of the resulting pores 14(6)–14(11) has a generally, cone-shaped cross-sectional shape for the first sections 40(1)–40(6) and a circular cross-sectional shape for the second sections 42(1)–42(6), although each of the pores 14(6)–14(11) can have other types of cross-sectional shapes for each of the sections 40(1)–40(6) and 42(1)–42(6).

Accordingly, the present invention provides a device for generating electric current by the direct conversion of radioactive energy or light with high efficiency. The examples described herein used porous silicon technology to distribute the radioisotope power source or light source throughout the device volume in close proximity to p-n junction conversion layers fabricated on the pore walls. Measurements of the current-voltage (I-V) characteristics of these exemplary devices demonstrated that the portion of power generated within the pore space was produced a factor of ten more efficiently than power coming from the devices with planar surfaces. In other words, essentially all the tritium decay electrons emitted in the channels in the pores entered the p-n junction regions on the walls of the pores. This demonstrates the accomplishment of the present invention. Additionally, these examples also illustrated the pronounced photoelectric response when the direct energy conversion devices in accordance with the present invention are illuminated with light.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Further, the recited order of elements, steps or sequences, or the use of numbers, letters, or other designations therefore, is not intended to limit the claimed processes to any order except as may be explicitly specified in the claims. Accordingly, the invention is limited only by the following claims and equivalents thereto.

What is claimed is:

1. A method of making an energy conversion device, the method comprising:

forming a plurality of pores within a substrate;

forming a junction region within each of the plurality of pores, each of the junction regions has a depletion region and each of the plurality of pores defines an opening size in the substrate and a spacing from adjacent pores so that the depletion regions of each of the pores is at least substantially in contact with the depletion region of the pores which are adjacent;

forming a first portion of one or more side walls of at least one of the pores with a declination angle of less than about fifty-five degrees; and forming a second portion of the one or more side walls of the at least one pore with a declination angle greater than about fifty-five degrees.

2. The method as set forth in claim 1 wherein one or more of the depletion regions of the pores overlap with the depletion regions of adjacent pores.

3. The method as set forth in claim 1 wherein an electrical field in a region of the plurality of pores is substantially continuous.

4. The method as set forth in claim 1 wherein each of the pores has an aspect ratio of greater than about 50:1.

5. The method as set forth in claim 1 wherein each of the pores has a diameter of less than about 1 µm.

6. The method as set forth in claim 1 wherein each of the pores has a depth from a surface of the substrate of greater than about 100 µm.

7. The method as set forth in claim 1 wherein the forming a plurality of pores within a substrate further comprises forming at least one of the pores with one or more side walls with a declination angle greater than about fifty-five degrees relative to a surface in a substrate in which the pores are formed.

8. The method as set forth in claim 1 further comprising providing a convertible energy source which provides convertible energy to the junction regions.

9. The method as set forth in claim 8 wherein the convertible energy source is source of radioactive material.

10. The method as set forth in claim 9 wherein the radioactive material is tritium.

11. The method as set forth in claim 8 wherein the source of convertible energy is a light source.

12. A method of making an energy conversion device, the method comprising:

providing a substrate;

forming a plurality of junction regions in the substrate, wherein a first portion of at least one of the junction regions has a declination angle of greater than about fifty-five degrees relative to a second portion of each of the junction regions, wherein each of the junction regions has a depletion region and each of the junction regions is spaced from the adjacent junction regions so that the depletion regions are at least substantially in contact with each other;

forming a first section of at least one of the plurality of junction regions with a declination angle less than about fifty-five degrees relative to the second portion of the at least one of the junction regions; and forming a second section of the at least one of the plurality of junction regions with a declination angle greater than about fifty-five degrees relative to the second portion of the at least one of the junction regions.

13. The method as set forth in claim 12 wherein one or more of the depletion regions of the junction regions overlap with the depletion regions of adjacent junction regions.

14. The method as set forth in claim 12 wherein an electrical field in a region of the plurality of junction regions is substantially continuous.

15. The method as set forth in claim 12 further comprising a convertible energy source which provides convertible energy to the junction regions.

16. The method as set forth in claim 15 wherein the convertible energy source is source of radioactive material.

17. The method as set forth in claim 16 wherein the radioactive material is tritium.

18. The method as set forth in claim 15 wherein the source of convertible energy is a light source.

* * * * *